(12) United States Patent
Slobodnik et al.

(10) Patent No.: US 7,434,119 B2
(45) Date of Patent: Oct. 7, 2008

(54) METHOD AND APPARATUS FOR MEMORY SELF TESTING

(75) Inventors: Richard Slobodnik, Austin, TX (US); Frank David Frederick, Austin, TX (US)

(73) Assignee: ARM Limited, Cambridge (GB)

( * ) Notice: Subject to any disclaimer, the term of this patent is extended or adjusted under 35 U.S.C. 154(b) by 484 days.

(21) Appl. No.: 11/072,626

(22) Filed: Mar. 7, 2005

(65) Prior Publication Data

US 2006/0200713 A1    Sep. 7, 2006

(51) Int. Cl.
*G11C 29/00* (2006.01)
(52) U.S. Cl. .................................. 714/718; 714/763
(58) Field of Classification Search .................... None
See application file for complete search history.

(56) References Cited

U.S. PATENT DOCUMENTS

| | | | | |
|---|---|---|---|---|
| 5,636,227 A | * | 6/1997 | Segars | 714/729 |
| 5,659,748 A | * | 8/1997 | Kennedy | 713/2 |
| 5,920,515 A | * | 7/1999 | Shaik et al. | 365/200 |
| 6,000,006 A | * | 12/1999 | Bruce et al. | 711/103 |
| 6,067,262 A | * | 5/2000 | Irrinki et al. | 365/201 |
| 6,691,270 B2 | * | 2/2004 | Blasco Allue et al. | 714/729 |
| 2003/0120985 A1 | * | 6/2003 | Slobodnik et al. | 714/718 |
| 2003/0167426 A1 | * | 9/2003 | Slobodnik | 714/718 |

* cited by examiner

*Primary Examiner*—Phung M Chung
(74) *Attorney, Agent, or Firm*—Nixon & Vanderhye P.C.

(57) ABSTRACT

A memory self-test system is provided comprising a self-test controller operable in self-test mode to generate a sequence of generated memory addresses for performing memory access operations associated with the memory test algorithm having an associated memory cell physical access pattern. A programmable re-mapper is operable to re-map the sequence of generated memory addresses derived from the self-test instruction to a sequence of re-mapped memory addresses. The programmable re-mapper performs this re-mapping in response to programmable mapping selection data. The re-mapping of the generated memory addresses to re-mapped memory addresses ensures that the memory cell accesses performed during execution of the memory self-test are consistent with the associated memory cell physical access pattern regardless of the particular implementation of the memory array.

13 Claims, 12 Drawing Sheets

Sequence:
1) Wscan data (row fast increment)
2) R W_ R_  incr
3) R_ W R   incr
4) R W_ R_  decr
5) R_ W R   decr
6) Rscan data

```
// ADDRESS SELECTOR DECODINGS:   f e d c b a 9 8 7         6 5 4 3 2 1 0
//                               rowaddr [8] [7] [6] [5] [4] [3] [2] [1] [0] coladdr [6] [5] [4] [3] [2] [1] [0]

// GHB SCRAMBLE example  16 rows, 4 bit bitlinemux on bits[5:4]
L1_GHB_ROWS       [2:0]   = 3'b000;  // 000 = 16, 001 = 32, 010 = 64, 011 = 128, 100 = 256, 101 = 512
L1_ADDR_SCRAMBLE [119:116] = 4'H7:   // logical index 0 = row 0
L1_ADDR_SCRAMBLE [123:120] = 4'H8:   // logical index 1 = row 1
L1_ADDR_SCRAMBLE [127:124] = 4'H9:   // logical index 2 = row 2
L1_ADDR_SCRAMBLE [131:128] = 4'Ha:   // logical index 3 = row 3
L1_ADDR_SCRAMBLE [135:132] = 4'H0:   // logical index 4 = col 0
L1_ADDR_SCRAMBLE [139:136] = 4'H1:   // logical index 5 = col 1
L1_ADDR_SCRAMBLE [143:140] = 4'H2:   // logical index 6 = col 2
L1_ADDR_SCRAMBLE [147:144] = 4'H3:   // logical index 7 = col 3
```

Fig. 11

| Logical Signal | Physical Signal | ADDR_SCRAMBLE | Physical Use | Comment |
|---|---|---|---|---|
| rd_addr[7] | if_ghb_idx_f0[7] | L1_ADDR_SCRAMBLE[147:142] | colAddr[3] | Selects 1 of 4 blocks |
| rd_addr[6] | if_ghb_idx_f0[6] | L1_ADDR_SCRAMBLE[143:138] | colAddr[2] | |
| rd_addr[5] | if_ghb_idx_f0[5] | L1_ADDR_SCRAMBLE[139:134] | colAddr[1] | Selects 1 of 4 columns |
| rd_addr[4] | if_ghb_idx_f0[4] | L1_ADDR_SCRAMBLE[135:130] | colAddr[0] | |
| rd_addr[3] | if_ghb_idx_f0[3] | L1_ADDR_SCRAMBLE[131:126] | rowAddr[3] | Selects 1 of 16 rows |
| rd_addr[2] | if_ghb_idx_f0[2] | L1_ADDR_SCRAMBLE[127:122] | rowAddr[2] | |
| rd_addr[1] | if_ghb_idx_f0[1] | L1_ADDR_SCRAMBLE[123:118] | rowAddr[1] | |
| rd_addr[0] | if_ghb_idx_f0[0] | L1_ADDR_SCRAMBLE[119:114] | rowAddr[0] | |

Fig. 12

METHOD AND APPARATUS FOR MEMORY SELF TESTING

BACKGROUND OF THE INVENTION

1. Field of the Invention

This invention relates to the field of data processing systems. More particularly, this invention relates to the self-testing of memories within data processing systems to detect memory defects.

2. Description of the Prior Art

It is known to provide data processing systems incorporating memories with self-testing mechanisms, sometimes termed built-in self-test (BIST), such that when memory circuits have been fabricated, a series of self-tests can be performed to determine whether there are any memory defects present in that data processing system, which would indicate that circuits should be rejected.

As technology progresses there is a trend for memory sizes to increase in order to enable provision of more advanced applications. Accordingly, the defect density of these larger memories is becoming increasingly significant and the self-testing requirements more onerous. Furthermore, the memory modules incorporated in data processing systems vary considerably in physical configuration (i.e. the number of rows and columns comprising the memory array) and also vary in implementation such that a given address bit may select between adjacent rows in one implementation whereas it may select between adjacent columns or banks in another implementation. This presents a difficulty in provision of a generic memory self-test system, since BIST self-test algorithms target particular memory cell physical access patterns to expose particular memory defects. Failure to address memory cells according to the intended physical access patterns may result in loss of test quality, since in this case the algorithms no longer address the intended particular physical memory cells (locations) in precise sequential steps. For example a test may rely on an entire row of memory cells being set to a logical value 1, but the implementation-dependent addressing may mean that the addresses generated by the self-test instruction corresponds to a column and not a row. Thus, self-test algorithms such as a "bitline stress test" or a "checkerboard test" would not be correctly implemented if the memory cell physical access pattern did not match the intended memory cell physical access pattern due to differences in mappings between memory address indices and physical locations (i.e. cells) of a memory array.

SUMMARY OF THE INVENTION

Viewed from one aspect the present invention provides apparatus for processing data, said apparatus being operable in an operational mode and a self-test mode, said apparatus comprising:

at least one memory having a plurality of memory cells arranged according to a physical configuration, physical locations in said at least one memory of said plurality of memory cells being selected by respective memory addresses;

a self-test controller operable in said self-test mode to generate in response to a self-test instruction a sequence of generated memory addresses for performing respective memory-access operations in accordance with at least one memory test algorithm having an associated memory cell physical access pattern;

a programmable re-mapper responsive to programmable mapping selection data to re-map said sequence of generated memory addresses to a sequence of remapped memory addresses for selecting memory cells in said at least one memory such that said memory cells are accessed in accordance with said associated memory cell physical access pattern.

The invention recognises that, if during a self-test process the intended memory cell physical access pattern is not in fact implemented, then this may result in compromised test accuracy. This may occur when the intended patterns that probe particular memory defects no longer address the memory cells of the memory array in the intended sequential steps associated with the memory test algorithm due to a mismatch in the way that memory cells are indexed by a particular memory addressing implementation. Provision of a programmable re-mapper that is responsive to programmable mapping selection data to re-map a sequence of generated memory addresses provides for improved flexibility by enabling the same self-test controller to test the intended memory cell physical access pattern regardless of the particular address indexing implemented in the memory system under test. In particular, the present invention allows for the same memory cell physical access pattern to be targeted by the self-test instruction regardless of the manner in which memory under test has been set up to access memory rows, columns and blocks. Thus, the self-test controller is operable to produce a sequence of generated memory addresses, which can then be re-mapped in a programmable manner by the re-mapper to compensate for any differences in implementation of memory modules so that the memory cell physical access pattern that it is intended to target can be reproduced consistently. Furthermore, the present invention also allows address maps within the memory test algorithm to be efficiently re-assigned in order to target additional address/pattern relationships. The self-test hardware does not require hardware changes to accommodate different mappings since these changes can be made programmably.

Although the programmable mapping selection data could be loaded at various different times during implementation of the self-tests, in one embodiment the mapping selection data is loaded by the self-test controller simultaneously with the loading of the self-test instruction. This facilitates an efficient re-mapping from the generated memory addresses associated with the memory test algorithm to the re-mapped memory addresses which are used to access memory cells.

As well as specifying a sequence of generated memory addresses associated with a memory cell physical access pattern, a self-test instruction in one embodiment of the invention specifies at least one of: a pattern selection field for specifying the memory cell physical access pattern; a mapping selection data field for specifying mapping selection data; and a data field for specifying data to be written to the memory during the memory access operations. Inclusion of the mapping selection data within the self-test instruction is an efficient means by which to specify the address re-mapping and obviates the need for a separate instruction in which the mapping selection data is specified. The data field specifying data to be written to the memory can have an important influence upon the type of defects detected by a particular memory test and may be used to probe the potential vulnerabilities of memories in a way that may be readily configured by the particular manufacturer or user.

Although the self-test controller could be hard-wired to probe a particular memory array within the data processing apparatus, in one embodiment the self-test instruction specifies on which of a plurality of memories within the data processing apparatus, the self-test instruction should be executed. This allows targeted testing of particular memory modules within a complex data processing apparatus and provides additional flexibility to implement different test routines specifically suited to a given memory module.

It will be appreciated that the re-programmable mapping selection data offers the flexibility to specify any re-mapping between the generated addresses associated with the self-test instruction and the re-mapped memory addresses output by the programmable re-mapper. However, in one embodiment the mapping selection data is re-programmed to compensate for a change in the physical layout of the at least one memory of the data processing apparatus. Thus, for example, a change in configuration from a sixteen row by sixteen column memory array having four blocks of four columns to a thirty-two row by eight column array having two blocks of four columns and thirty-two rows can be easily accommodated by simply re-programming the mapping selection data and using the same generated memory addresses and the same self-test instruction.

In an alternative embodiment the mapping data is re-programmed to reflect a change in an implemented control configuration for a fixed physical layout of the at least one memory. For example, for a given sixteen row by sixteen column memory array, in one implemented control configuration the four least significant address bits could be used to specify different rows within the memory array whereas in a different implemented control configuration the most significant four address bits could be used to specify the rows within the memory. However the same memory cell physical access pattern could be targeted in each of these two different control implementations using the same generated memory addresses by simply re-programming the mapping selection data to accommodate the difference in addressing.

In yet a further alternative embodiment, for a given self-test instruction and generated address sequence, different memory cell physical access patterns could effectively be probed by a given self-test instruction by re-programming the mapping selection data in order to target a different memory cell physical access pattern for a given sequence of generated memory addresses. This could be achieved for example by defining the re-mapping such that the least significant row is switched to the most significant row, causing the test to move quickly between global wordlines (i.e. groups of wordlines) instead of local wordlines (individual wordlines).

The invention is particularly well suited to use with embodiments in which the self-test controller, the at least one memory and the processor core are fabricated together on an integrated circuit. As technology progresses memory is less frequently provided in the form of discrete integrated circuits produced by specialist memory manufacturers and is more typically incorporated within a single integrated circuit together with various other circuit components (such as processor cores) by a wider range of manufacturers such as ASIC producers, each producer implementing the memory according to their own particular memory control configuration (memory cell address indexing). By allowing for the programmable re-mapping of generated memory addresses associated with a self-test instruction, embodiments of the invention enable differences in implementation of memory arrays on different integrated circuits to be readily accommodated without compromising memory test accuracy.

It will be appreciated that the memories to be tested by the self-test system could take a variety of different forms. In particular, the memories could be custom memories or synthesised memories. Memory cells within these different types of memories will be accessed by address mappings that vary according to the memories themselves and their implementations.

An important consideration with the self-test controller is supporting the full range of self-test instructions that probe as many as possible potential defects of a memory system. The instructions should be selected such that they can be combined in a wide range of different ways to provide a broad coverage of possible test methodology. Accordingly, according to one embodiment of the invention, the self-test instructions implemented by the self-test controller allow one or more of the following test operations to be performed;

(i) writing specified data to all memory cells within a range of said memory addresses;

(ii) reading data from all memory cells within a range of said memory addresses;

(iii) write specified data to memory cells having a checkerboard pattern of memory addresses;

(iv) read data from memory cells having a checkerboard pattern of memory addresses;

(v) conduct a march C memory test;

(vi) read data from and write specified data to a sequence of memory cells within a memory arranged in rows and columns of memory cells such that memory cells within a row of memory cells are accessed in turn before a next row of memory cells is selected for access;

(vii) read data from and write specified data to a sequence of memory cells within a memory arranged in rows and columns of memory cells such that memory cells within a column of memory cells are accessed in turn before a next column of memory cells is selected for access;

(viii) read data from, write specified data to and read data from a sequence of memory cells within a memory arranged in rows and columns of memory cells such that memory cells within a row of memory cells are accessed in turn before a next row of memory cells is selected for access;

(ix) read data from, write specified data to and read data from to a sequence of memory cells within a memory arranged in rows and columns of memory cells such that memory cells within a column of memory cells are accessed in turn before a next column of memory cells is selected for access;

(x) for a sequence of memory cells, repeatedly write a value to one or more bitlines within said memory and then read a complementary value stored within a memory location sharing said one or more bitlines; and (xi) for a sequence of memory cells, repeatedly read a value from a memory location while interjecting opposing data writes;

(xii) a predetermined combination of memory test operations as defined in (i) to (xi) for go/nogo testing where manufacture's test methods do not have specific requirements; and (xiii) creating false read data at specific points in order to validate fail detection.

Viewed from another aspect the present invention provides a method of testing a memory having a plurality of memory cells arranged according to a physical configuration, physical locations in said at least one memory of said plurality of memory cells being selected by respective memory addresses, said method comprising the steps of:

generating in response to a self-test instruction a sequence of generated memory addresses for performing respective memory-access operations in accordance with at least one memory test algorithm having an associated memory cell physical access pattern;

remapping, in response to said said programmable mapping selection data, said sequence of generated memory addresses to a sequence of remapped memory addresses for selecting memory cells in said at least one memory such that said memory cells are accessed in accordance with said associated memory cell physical access pattern.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
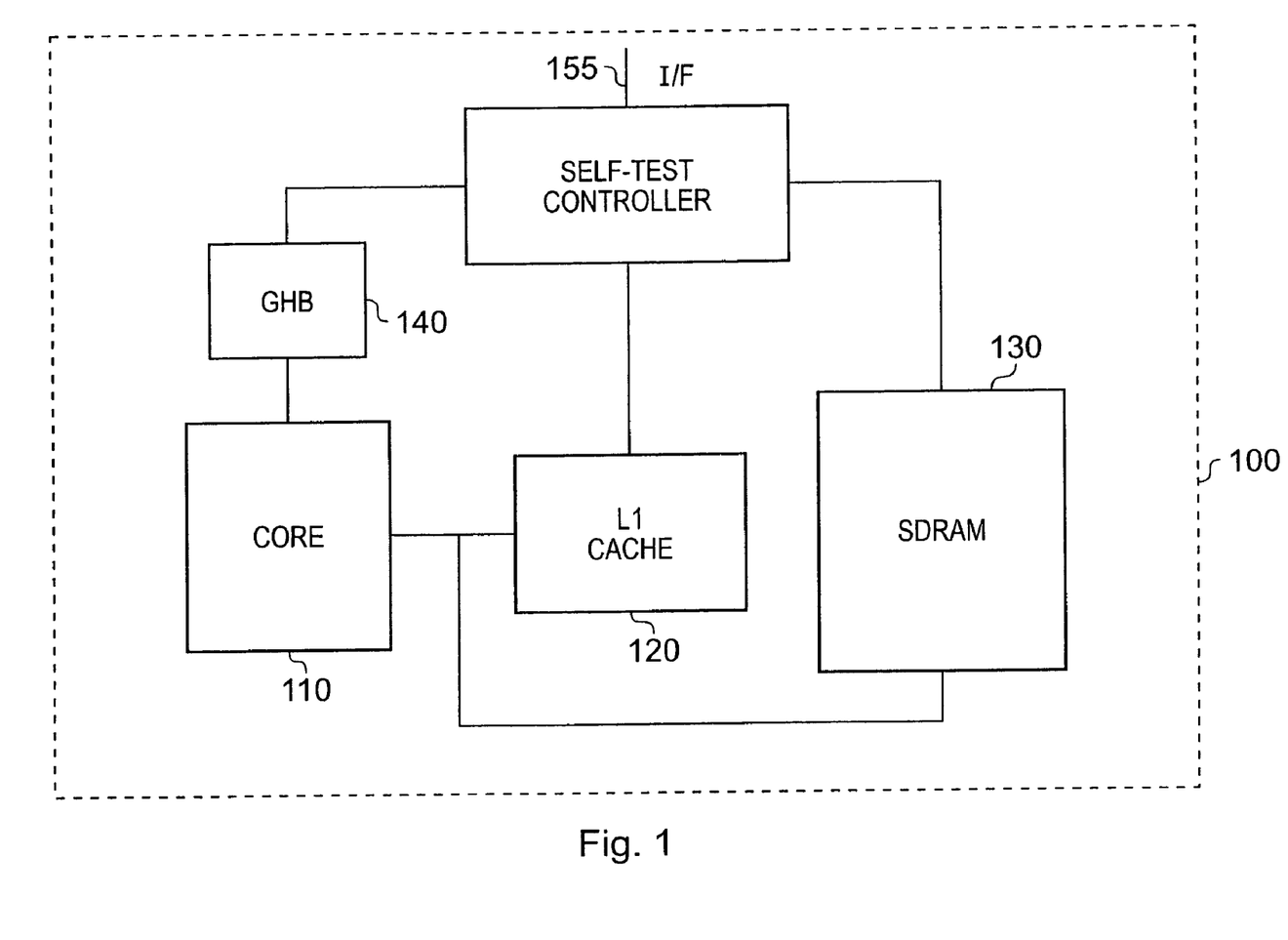
FIG. 1 schematically illustrates an integrated circuit incorporating a processor core, multiple memories and a self-test controller.

FIG. 1 schematically illustrates an integrated circuit 100 comprising a processor core 110, an L1 cache memory 120, an SDRAM 130, a global history buffer 140 and a self-test controller 150. A self-test interface 155 is provided to enable supply data to the self-test controller 150. It will be appreciated that the integrated circuit 100 will typically comprise many additional circuit elements which have not been illustrated in FIG. 1 for the sake of simplicity and clarity.

The processor core has direct access to the L1 cache 120, which is formed of static random access memory (SRAM) which enables high-speed memory access. The core 110 also has access to the global history buffer 140, which is used to store data associated with branch prediction, and access to the SDRAM 130, which is slower memory than the L1 cache 120 and is used to store less frequently accessed data. The self-test controller 150 is connected to each of the L1 cache 120, the SDRAM 130 and the global history buffer 140. Accordingly, the self-test controller can be employed to test any one of these three memory modules 120, 130 or 140 following fabrication of the integrated circuit 100. The self-test is performed in a self-test mode of the integrated circuit 100. Self-test instructions can be loaded into the self-test controller via the interface 155. The self-test controller is responsive to a self-test instruction to produce a sequence of generated memory addresses for performing memory-access operations in accordance with a memory test algorithm having an associated memory cell physical access pattern. The memory-access operations associated with the self-test probe any weaknesses in a given memory array by writing known data to and reading data from individual memory cells within that array according to a predetermined sequence and a given physical access pattern and comparing the read data with the expected output. The self-test controller 150 is operable to perform such a memory self-test following fabrication of the integrated circuit 100 before the integrated circuit is shipped for implementation. The self-test controller 150 is programmable to enable implementation of any one of the number of possible self-test algorithms so that different test requirements for different memory types and different memory implementations can be accommodated.

Figure 2:
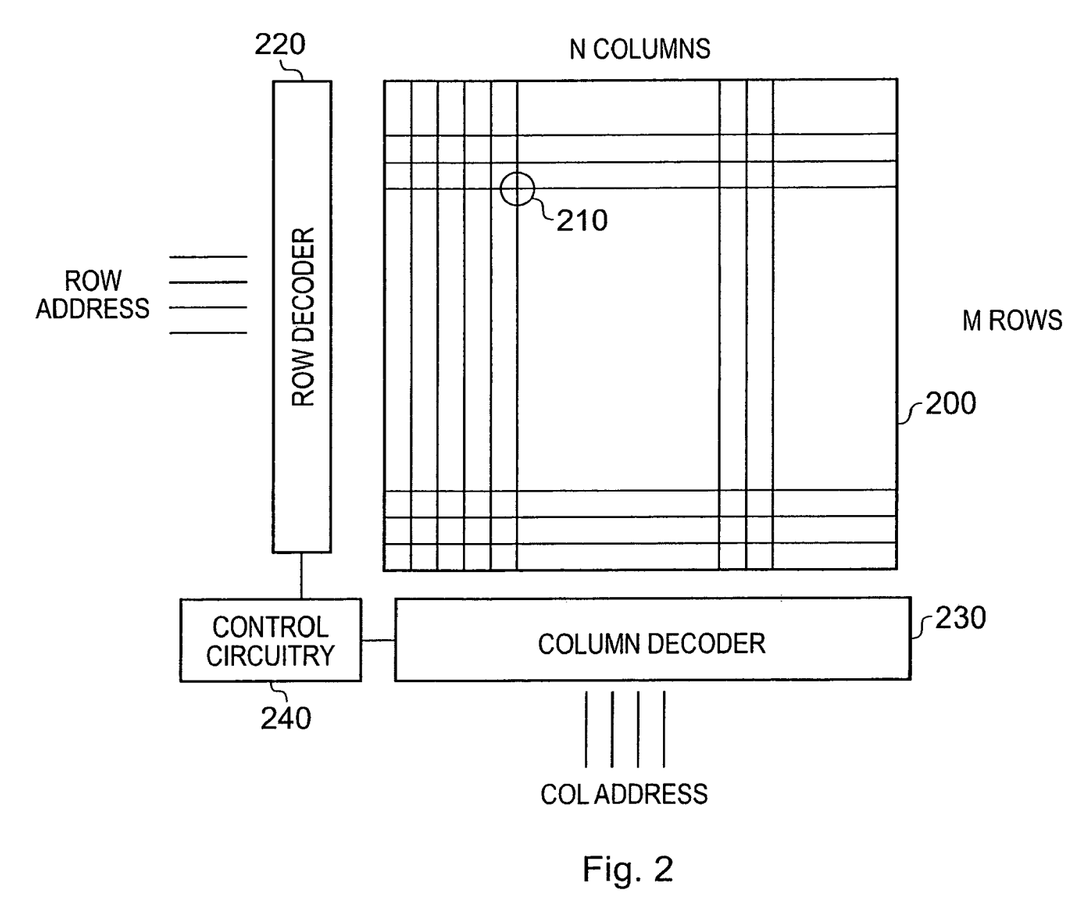
FIG. 2 schematically illustrates a memory array, a memory cell and associated memory access circuitry.

FIG. 2 schematically illustrates a memory array, such as the L1 cache 120 of FIG. 1. The memory array 200 comprises M rows and N columns and has an associated row decoder 220 and a column decoder 230. A set of control circuitry 240 is connected to both the row decoder 220 and the column decoder 230 to control memory access operations. The memory array 200 comprises a plurality of memory cells operable to store data. An individual memory cell 210 is shown in FIG. 2 and represents the interception of a row line and a column line. The physical configuration and relative locations of the memory cells are significant with regard to the operations performed by the memory test algorithm. In particular, each memory test algorithm is directed to target a particular memory cell physical access pattern, that may represent, for example, read and write operations along contiguous memory cells of a row or down contiguous memory cells of a column. The processor core 110 accesses data stored in the memory array by indexing memory cells of the memory array using certain row addresses and column addresses. Although a given size of address field is required to index and access a memory array having a given number of memory cells, the manner in which the address bits are mapped to the physical memory cells (i.e. physical locations) of the array can vary considerably between different implementations. Each memory cell in SRAM such as the L1 cache 120 contains a pair of cross-coupled inverters which form a bi-stable element. These inverters are connected to a pair of bitlines through pass transistors, which provide differential read and write access. The row decoder 220 activates one of the M wordlines associated with the rows. Each wordline connects the memory cells of a given row to their respective bitlines. The column decoder 230 sets the pair of column switches that connects one of the N bitline columns to peripheral circuits. The row decoder can be arranged to select groups of wordlines or individual wordlines. A group of wordlines corresponds to a global wordline whereas individual wordlines correspond to local wordlines. The column decoder 230 comprises sense amplifiers to amplify the output signals. The row decoder 220 enables a memory cell from any given row of the memory array 200 to be accessed in dependence upon a row address whereas the column decoder 230 enables a given memory cell in a particular column of the memory array to be accessed based upon the column address. Performing accesses to read data from or write data to individual memory cells of the memory array 200 depends upon physical signals supplied to the bitlines and wordlines.

Figure 3:
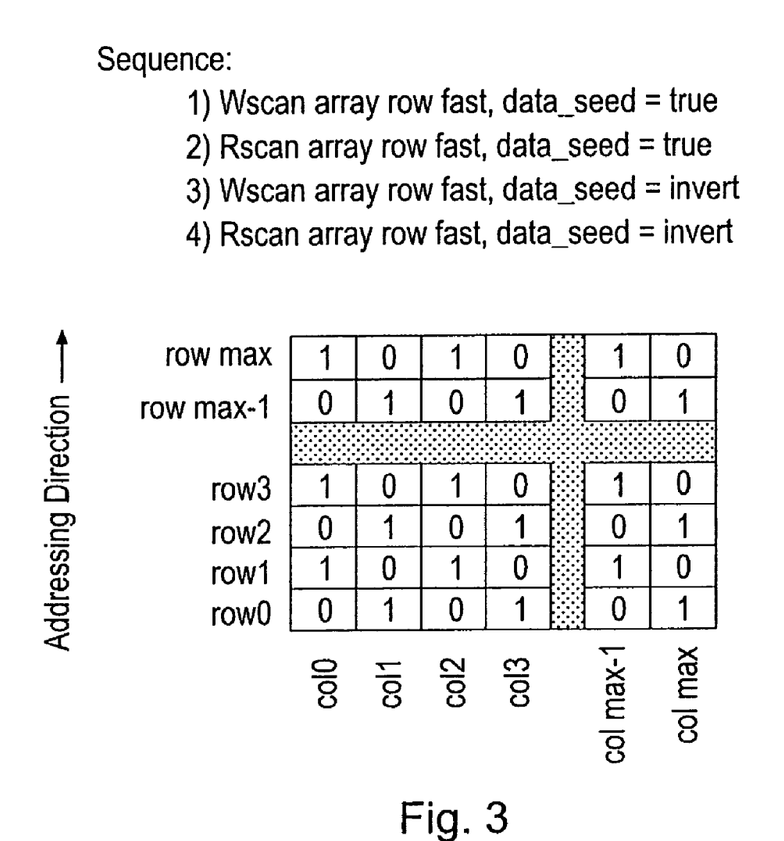
FIG. 3 schematically illustrates a checkerboard memory cell physical access pattern.

FIG. 3 schematically illustrates the memory test algorithm that implements a "checkerboard" memory cell physical access pattern. According to the checkerboard memory algorithm, alternate bits in each row and each column of the memory array are set to logical "1" values. FIG. 3 shows the physical memory array pattern after a first checkerboard scan. The memory algorithm sequence is shown in FIG. 3 and comprises a first step of writing the entire memory array according to a pattern where a data seed is set to true. A second step involves reading the entire data array with the data seed still set to true. If the same values are read from the array as the known values that were previously written, this is indicative of correct operation. The third step involves writing the entire array with the data seed inverted such that all of the logical 1's in the array become logical 0's and all of the logical 0's in the array become logical 1's. The fourth and final step involves reading the entire array with the data seed still set at an inverted value. The values read from the memory array at the second and fourth stages should match the values written to the memory array at the first and third stages respectively. If the data read from a memory cell the array does not match the data written to the corresponding memory cell immediately previously, then this is indicative of a memory defect.

Figure 4:
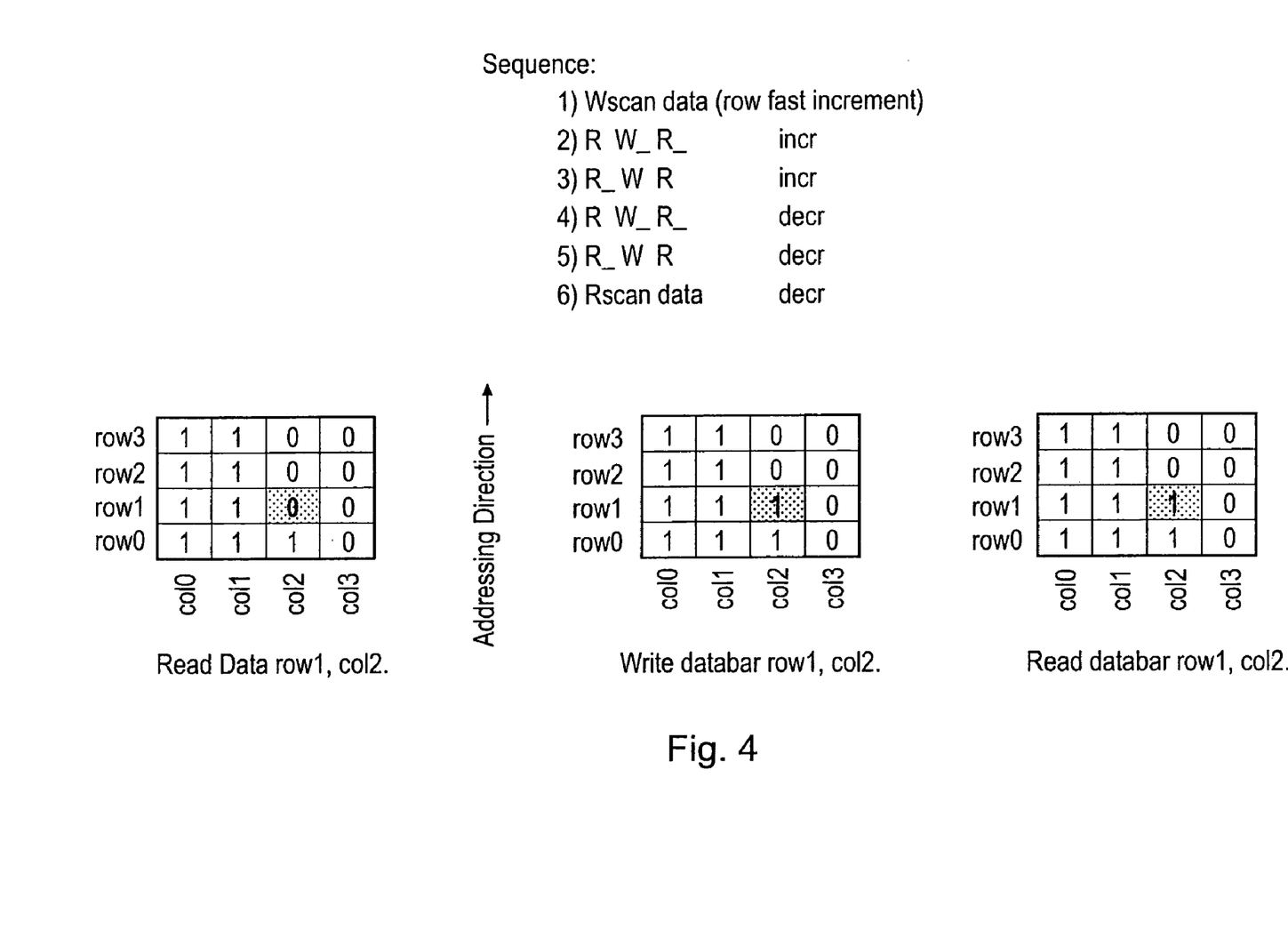
FIG. 4 schematically illustrates a "MARCHC" memory cell physical access pattern.

FIG. 4 schematically illustrates a different memory test algorithm, in this case an "XMARCHC" memory test pattern. The "MARCHC" memory test is commonly used to test embedded memories. FIG. 4 shows a state of a sample four row by four column memory array during the second stage in the test sequence (on row 1 in column 2). The sequence as shown in FIG. 4, involves a first stage of writing data to the entire memory array using a row fast increment. The second stage involves reading a data seed (i.e. data value one or zero), writing an inverted data value and reading that same inverted data value from a given memory location (as illustrated in FIG. 4 the particular memory cell location is the row 1 in column 2). The third stage involves then reading an inverted data seed, writing a data seed and reading that same data seed. The fourth step in the sequence involves reading a data seed, writing an inverted data seed and the inverted data seed. A fifth step of the sequence involves reading an inverted data seed, writing a data seed and then reading data seed. The sixth and final step in the sequence involves an Rscan operation during which the entire array is read. At the end of stages 2 and 3 of the sequence the address is incremented, whereas at the end of stages 4, 5 and 6 the address is decremented. Successful operation of the memory is indicated when a data value written to that memory cell at an immediately previous stage matches the value read from the memory cell at the subsequent stage.

Figure 5:
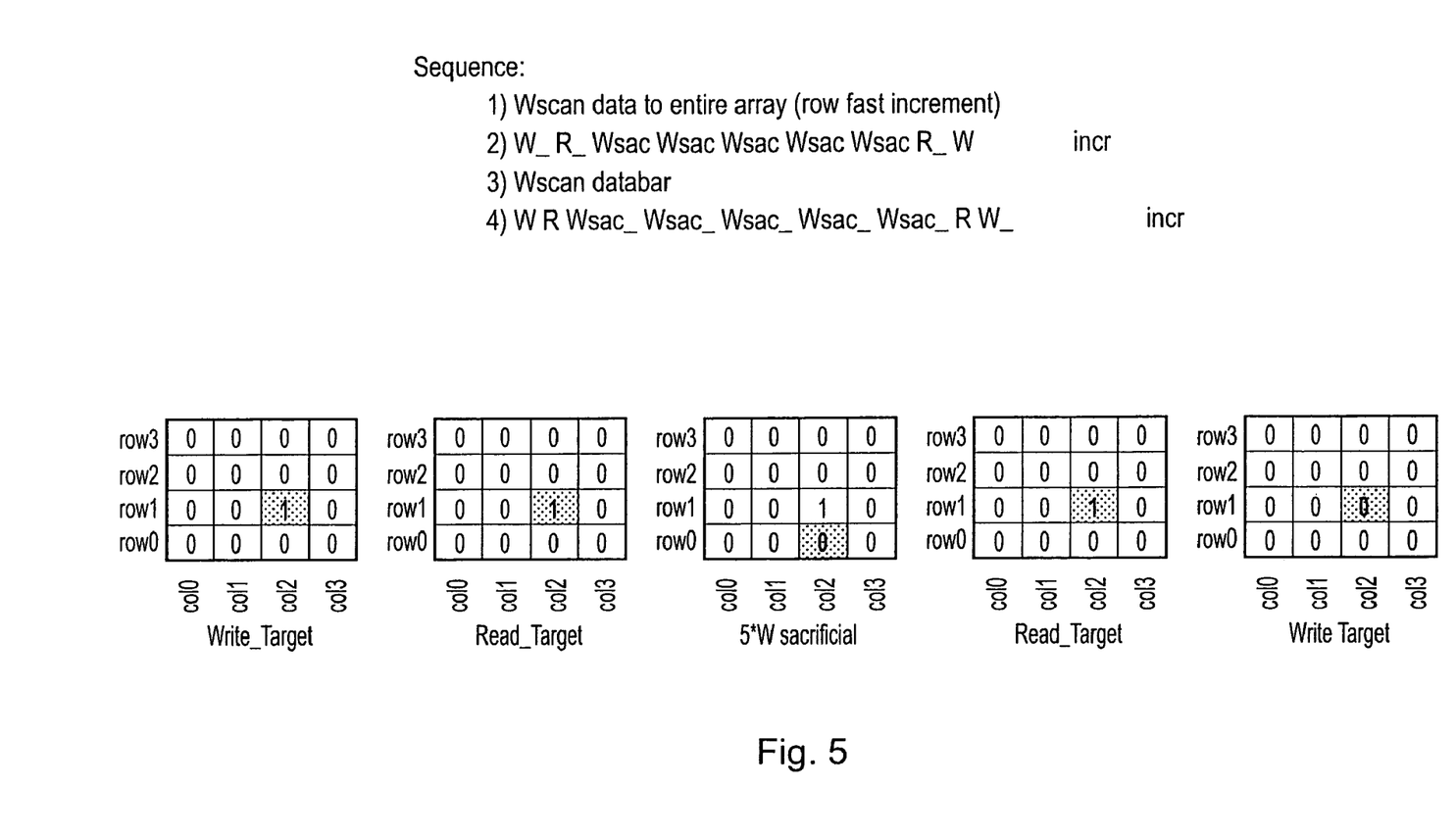
FIG. 5 schematically illustrates a "WRITEBANG" memory cell physical access pattern used to test bitline stress.

FIG. 5 schematically illustrates a third memory algorithm representing a "WRITEBANG" memory test. This WRITE-BANG pattern is used as a bitline stress test. The pattern operates on a bitline pair (i.e. a column) and is designed to detect faults in target data cells on a given targeted column. This is achieved by "banging" the bit sign to the opposite data state of the target read operation, attempting to create an undesired balance in the bitline pair in which the memory cell must then establish the opposite differential. This test serves to exaggerate any insufficient bitline pre-charge/equalisation during operation of the memory. Furthermore, the target memory cell has the opposite data from all other members of the bitline pair. This is a worst-case bitline condition for a memory cell to drive, since any bit cell leakages from the bitline pair members will collectively oppose the targeted read. FIG. 5 shows a snap shot representing the stage of a 4 row by 4 column memory array during a second sequence stage of the WRITEBANG algorithm acting on row 1 and column 2 of the memory arary. As shown in FIG. 5, the first stage of the sequence involves writing data to the entire array during a row fast increment. The second stage of the sequence involves a write using an inverted seed followed by a read of the inverted seed followed by five "WSAC" operations, which indicate a write operation to row 0. These five WSAC operations are known as sacrificial write operations. Subsequently the read is performed on row 1 column 2 using the data seed and then a write operation is performed using the inverted data seed. The address is incremented at the end of the second stage of the sequence. The third stage of the sequence involves a write to the entire array using an inverted data seed. The fourth and final stage of the sequence involves: a write using the data seed; a read of the data seed; five sacrificial write operations using an inverted data seed; and a read of row 1 column 2 set at data seed following by a write of the inverted data seed. The address is then incremented at the end of the fourth stage of the sequence. In the WRITEBANG test as the address marches through the memory array, the targeted row is left with the data to ensure that other target rows experience maximum leakage (which tests bitline stress).

FIGS. 3, 4 and 5 give three examples of memory cell physical access patterns used during self-test, but it will be appreciated that these three example algorithms represent a sub-set of a plurality of possible tests that may be implemented using the memory test algorithms. Further examples of the patterns specified by the self-test instruction include one or more of the following:

writing specified data to all memory cells within a range of said memory addresses;

reading data from all memory cells within a range of said memory addresses;

write specified data to memory cells having a checkerboard pattern of memory addresses;

read data from memory cells having a checkerboard pattern of memory addresses;

conduct a march C memory test;

read data from and write specified data to a sequence of memory cells within a memory arranged in rows and columns of memory cells such that memory cells within a row of memory cells are accessed in turn before a next row of memory cells is selected for access;

read data from and write specified data to a sequence of memory cells within a memory arranged in rows and columns of memory cells such that memory cells within a column of memory cells are accessed in turn before a next column of memory cells is selected for access;

read data from, write specified data to and read data from a sequence of memory cells within a memory arranged in rows and columns of memory cells such that memory cells within a row of memory cells are accessed in turn before a next row of memory cells is selected for access;

read data from, write specified data to and read data from to a sequence of memory cells within a memory arranged in rows and columns of memory cells such that memory cells within a column of memory cells are accessed in turn before a next column of memory cells is selected for access;

for a sequence of memory cells, repeatedly write a value to one or more bitlines within said memory and then read a complementary value stored within a memory location sharing said one or more bitlines; and for a sequence of memory cells, repeatedly read a value from a memory location while interjecting opposing data writes;

a predetermined combination of memory test operations as defined above for go/nogo testing where manufacture's test methods do not have specific requirements; and creating false read data at specific points in order to validate fail detection.

Figure 6A:
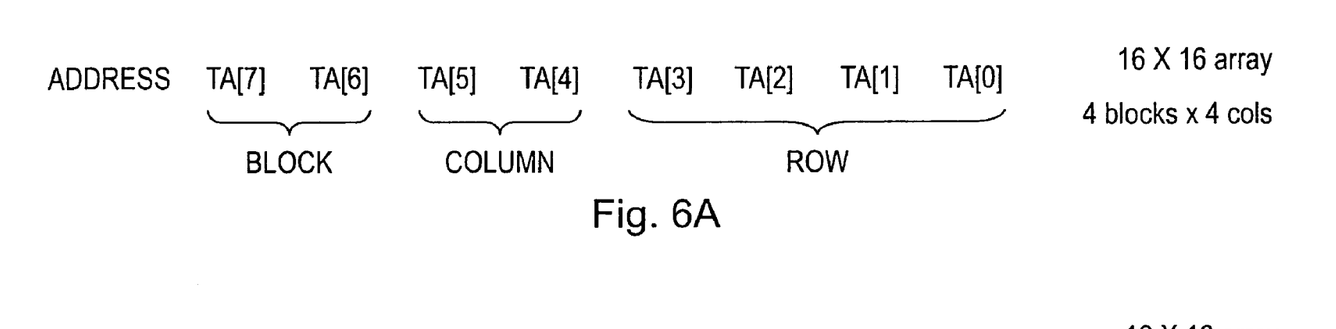
FIG. 6 schematically illustrates three different implementations of memory control in which different address bits are used to index respective rows, columns and blocks of the memory cell array.
Figure 6B:
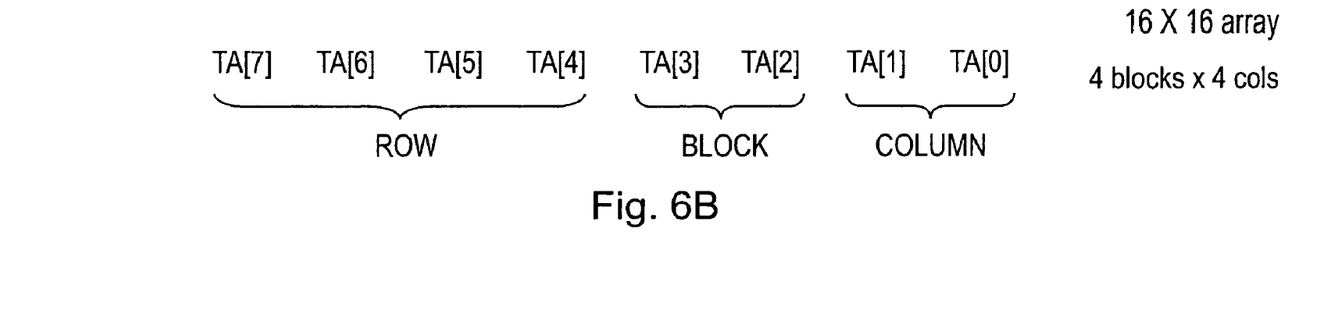
Figure 6C:
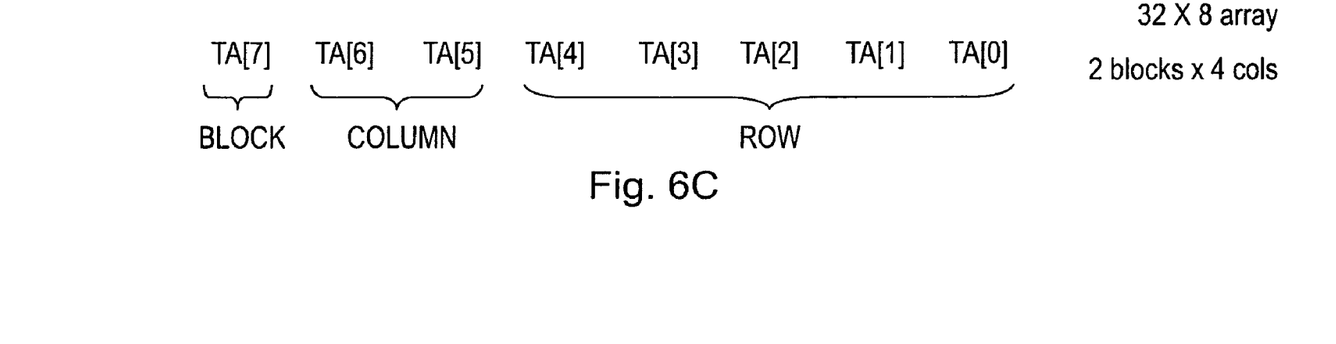

FIGS. 6A, 6B and 6C schematically illustrate how memory address bits are allocated in three alternative memory implementations. In FIG. 6A an 8-bit address represents a 16 row by 16 column memory array, which is configured such that it has 16 rows and 4 blocks comprising 4 columns each. In this implementation the least-significant four address bits, A[0] to A[3], are used to index the 16 rows, the next two most significant address bits, A[4] and A[5], are used to index the 4 columns of a given block and the two most-significant address bits A[6] and A[7] are used to index the 4 blocks. In the implementation of FIG. 6B, again the 8-bit address represents a 16 row by 16 column memory array physically configured in exactly the same way as the example of FIG. 6A such that it has 4 blocks of 4 columns each. However, in this case, the memory control is implemented such that the 8-bit address is used to index the memory cells that array in a different way from the memory indexing used in FIG. 6A. In particular, the two least significant bits of the address, A[0] and A[1], are used to index the 4 columns of a given block, whereas the address bits A[2] and A[3] are used to index the 4 blocks and the four most significant bits A[4] to A[7] are, in this case, used to index the 16 rows. It will be appreciated by comparison of the addressing schemes used in FIGS. 6A and 6B that for a given memory test algorithm, the generated addresses associated with a physical access pattern and a given self-test instruction will have to be re-mapped in different ways when the memory array is implemented such that it is indexed in the manner of FIG. 6A relative to the remapping to account for the address to ensure that the same sequence of memory cell locations are accessed in both cases indexing indicated in FIG. 6B.

FIG. 6C shows an 8-bit memory address used to index a memory array configured such that it has 32 rows and 8 columns. In this case, the memory is configured such that there are 2 blocks comprising 4 columns each. The rows and columns of this memory array are indexed such that the five least-significant address bits are used to access the 32 rows of the array, whereas the address bits A[5] and A[6] are used to index the 4 columns, leaving the most significant address bit A[7] to index the 2 blocks of the array.

Figure 7:
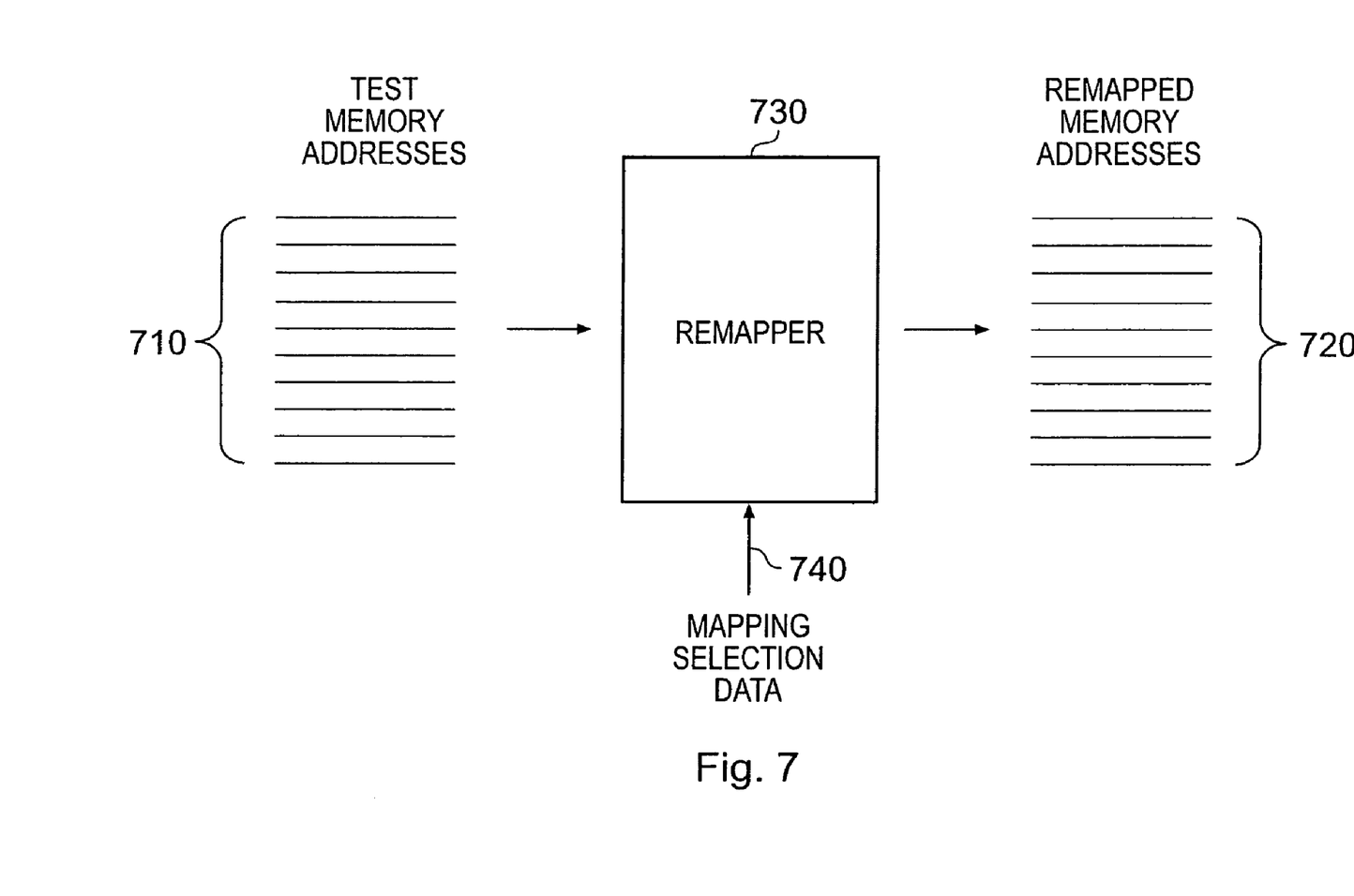
FIG. 7 schematically illustrates the re-mapping of generated memory addresses to re-mapped memory addresses in dependence upon mapping selection data.

FIG. 7 schematically illustrates the re-mapping of generated memory addresses to re-mapped memory addresses. As shown in FIG. 7 a set of generated memory addresses 710 is converted to a set of re-mapped memory addresses 720 by a re-mapper 730 in dependence upon input mapping selection data 740. The generated memory addresses are produced by the self-test controller in response to the self-test instruction and are associated with a given memory cell physical access pattern. The re-mapper 730 is operable to convert these generated memory addresses to the set of re-mapped memory addresses 720, which are used to drive the memory array under test such that any differences in configuration of the memory array or implementation of the memory array can be compensated for by the programmable re-mapper 730 using the mapping selection data 740. The re-mapper 730 is programmed to compensate for any change or differences in implementations of the memory arrays such that the memory cell physical access pattern is properly targeted regardless of any differences in the address indexing of the memory array (as illustrated in FIGS. 6A to 6C), such that the tests are properly implemented based upon the relative physical locations of the memory cells.

Figure 8:
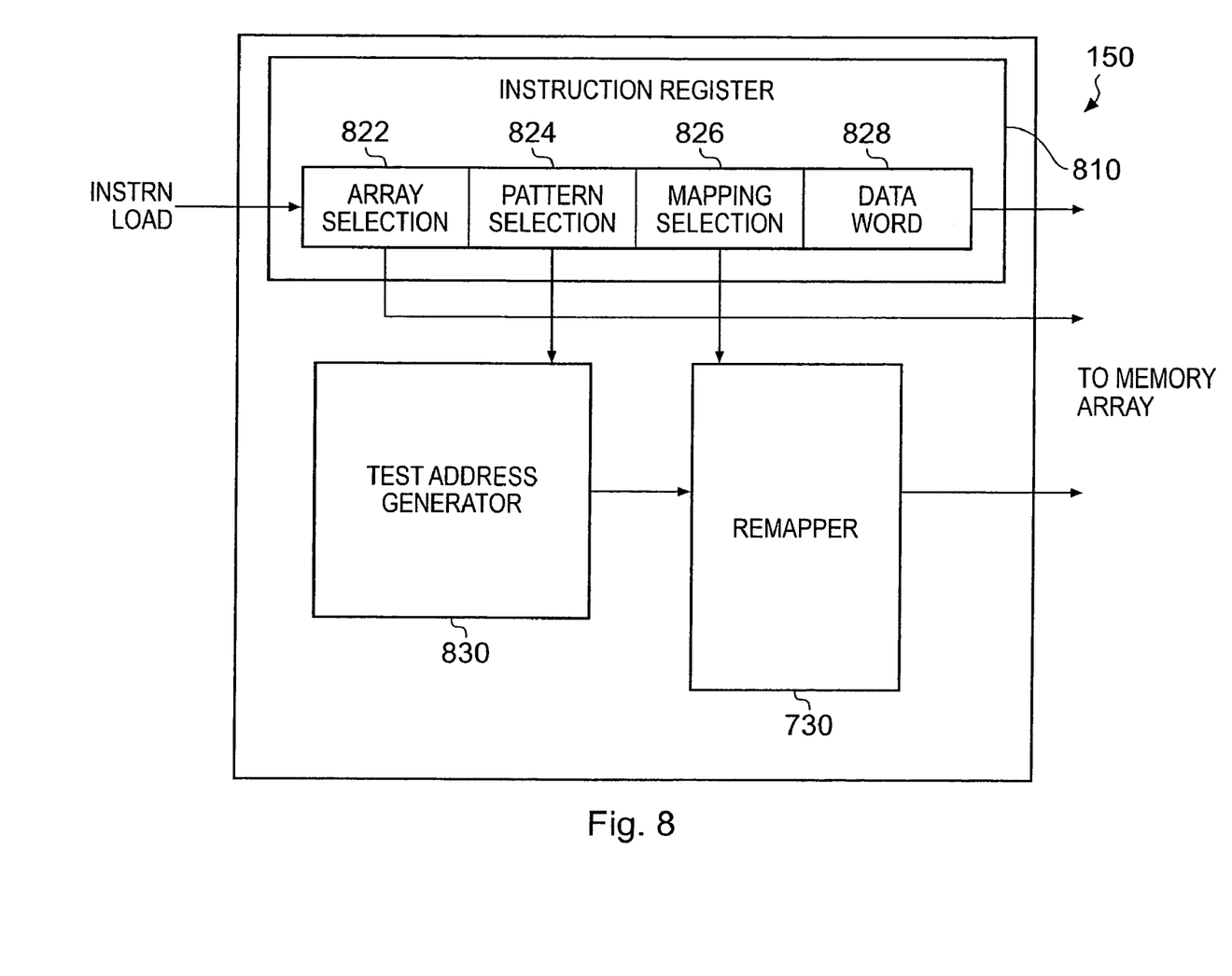
FIG. 8 schematically illustrates the self-test controller of FIG. 1 in more detail.

FIG. 8 schematically illustrates the self-test controller 150 of FIG. 1 in more detail. The self-test controller 150 comprises an instruction register 810 operable to load a self-test instruction 820 comprising a number of distinct instruction fields. As shown in FIG. 8 the self-test instruction 820 comprises an array selection field 822; a pattern selection field 824; a mapping selection data field 826 and a data word 828. The self-test controller 150 also comprises a test address generator 830 and the re-mapper 730 (as illustrated in FIG. 7).

Consider now what is specified by the fields 822, 824, 826 and 828 of the self-test instruction 820. The array selection field 822 is used to select which of the memory arrays of the arrangement of FIG. 1 is to be targeted for the self-test operations. In particular, the memory test algorithm will be directed to test one of the L1 cache 120, the SDRAM 130 or the global history buffer 140. The pattern selection field 824 will specify which one of a plurality of possible memory test algorithms (or methodologies) is to be employed on the given array. For example, one or more of the tests illustrated in FIGS. 3, 4 and 5 may be specified by this pattern selection field 824. The mapping selection data field 826 is used to specify the mapping selection data that defines how the generated memory addresses produced in response to the self-test instruction should be converted to re-mapped memory addresses for driving a particular implementation of a memory array. In a simple arrangement there may be one to one mapping of the generated memory addresses to the re-mapped memory addresses. However, in some embodiments the relationship between the generated memory addresses and the re-mapped memory addresses may be more complex e.g. an output address bit may be a function of more than one input address bit. The data word field 828 may be used to contain the data word to be written to memory cells or read from memory cells during the above-described self-test operations.

The test address generator 830 is responsive to a self-test instruction to generate a sequence of generated memory addresses in accordance with at least one memory test algorithm having associated memory cell physical access pattern. Accordingly, the data from the pattern selection field 824 of the self-test instruction 820 is supplied directly to the test generator. The data specified by the mapping selection data field 826 is supplied directly to the re-mapper 730, since this data is used to define the re-mapping between the generated test addresses and the re-mapped addresses. The values specified in the array selection field 822 and the data word field 828 are output to the memory array as are the re-mapped addresses output by the re-mapper 730. The inclusion of the mapping selection data as a field in the self-test instruction enables the mapping selection data to be loaded substantially simultaneously with the self-test instruction.

Figure 9:
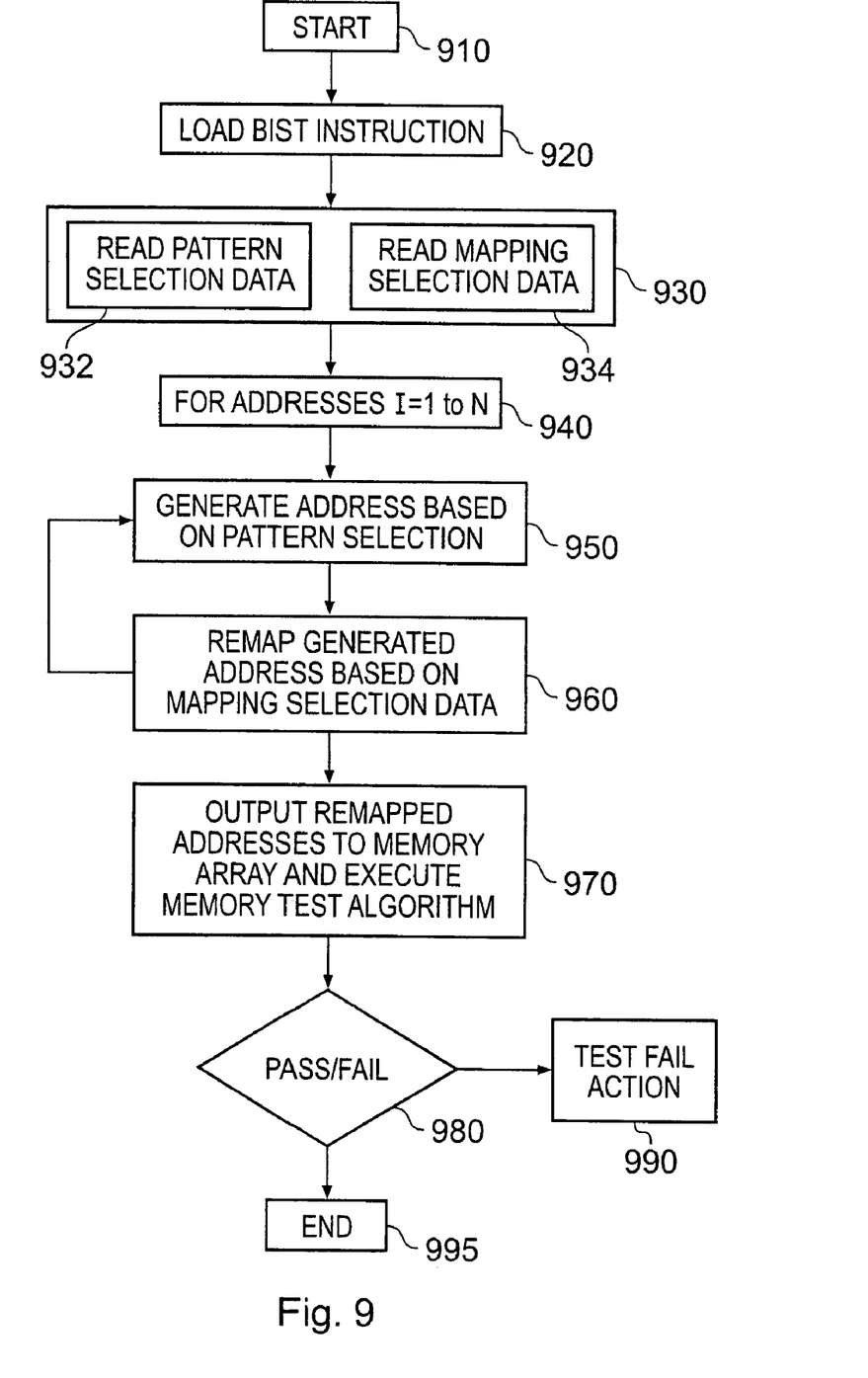
FIG. 9 is a flow chart that schematically illustrates the use of the self-test controller of FIG. 1.

FIG. 9 is a flow chart that schematically illustrates the operation of the self-test system. The process starts at stage 910 where the self-test is initiated following fabrication of the integrated circuit 100 and the integrated circuit 100 is in the self-test mode. At stage 920, the self-test instruction is loaded into the self-test controller 150 via the interface 155. Subsequently, at stage 930 the pattern selection data and the mapping selection data contained within fields 824 and 826 of the self-test instruction 820 respectively are read by the self-test controller. The pattern selection data 824 is supplied to the test address generated 830 whereas the mapping selection data 826 is supplied to the re-mapper 730. The process then continues to the address generation stage where a sequence of memory addresses associated with a given memory cell physical access pattern are produced. A plurality of such addresses will be associated with a given self-test instruction. Accordingly at stage 940 a loop is performed for all addresses generated in response to the self-test instruction loaded at stage 920. Thus for addresses i=1 to N, an address is derived based upon the pattern selection data and then that address is supplied to the re-mapper 730 where a re-mapped address is generated based upon the mapping selection data. These two steps are repeated until all of the generated addresses are converted to re-mapped addresses. Subsequently at stage 970 the re-mapped addresses are output to the memory array specified for test by the array selection data 822 and the memory test algorithm is executed.

After the particular self-test instruction has completed execution at stage 970, it is subsequently determined whether a pass or fail result has been returned by the self-test controller 150. If a fail result has been returned, the processing proceeds to stage 990 where a desired fail action is triggered. In this event remedial action may be taken to compensate for any minor faults or it may be determined that it is appropriate to discard the faulty integrated circuit. If the result at stage 980 was a pass, then the processing of the self-test instruction terminates directly at stage 995. Further tests may be performed on the given memory array depending upon the particular requirements of the self-test system.

Figure 10A:
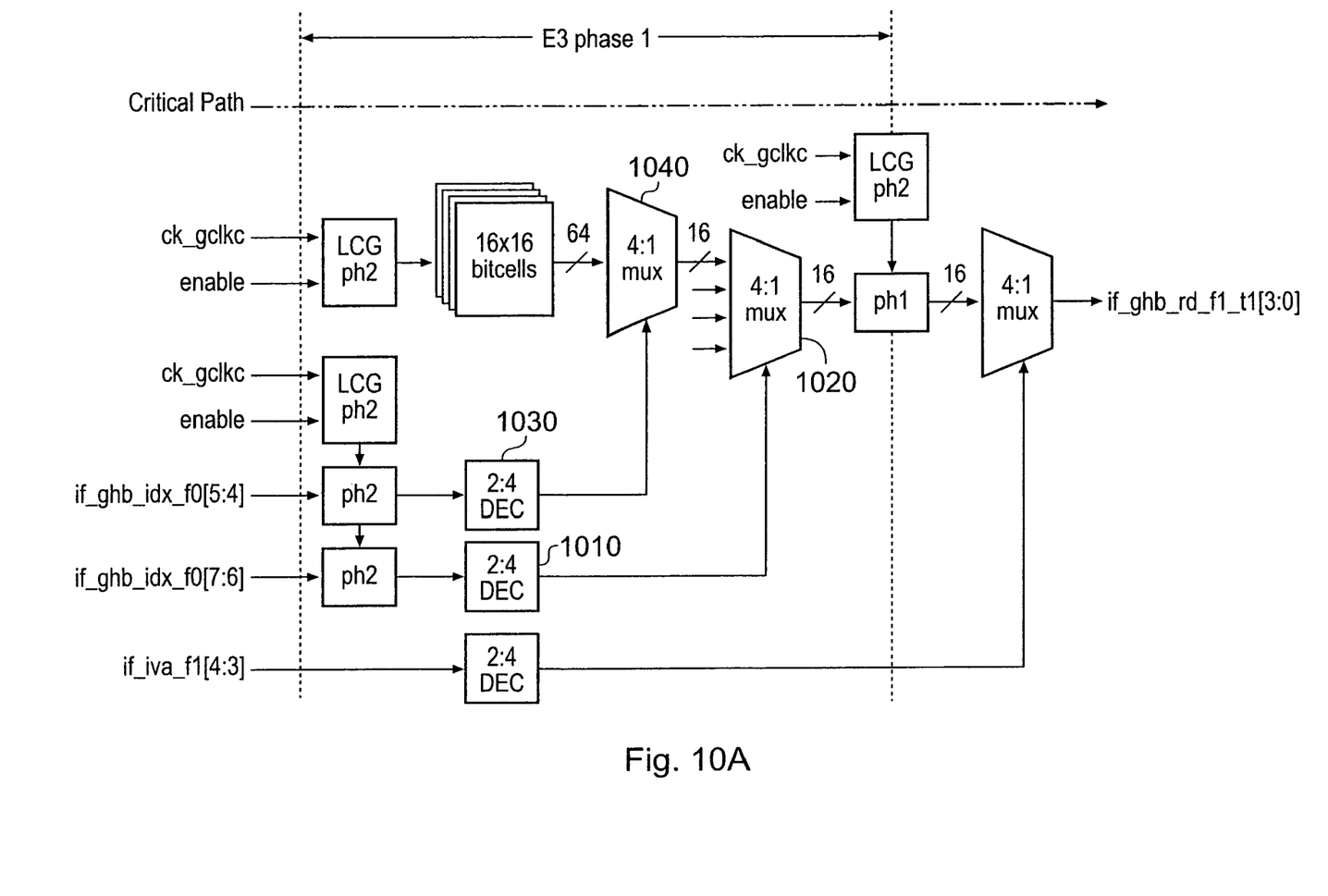
FIGS. 10A and 10B schematically illustrates circuitry within the global history buffer of FIG. 1 that is used to access rows, columns and blocks of the memory array.
Figure 10B:
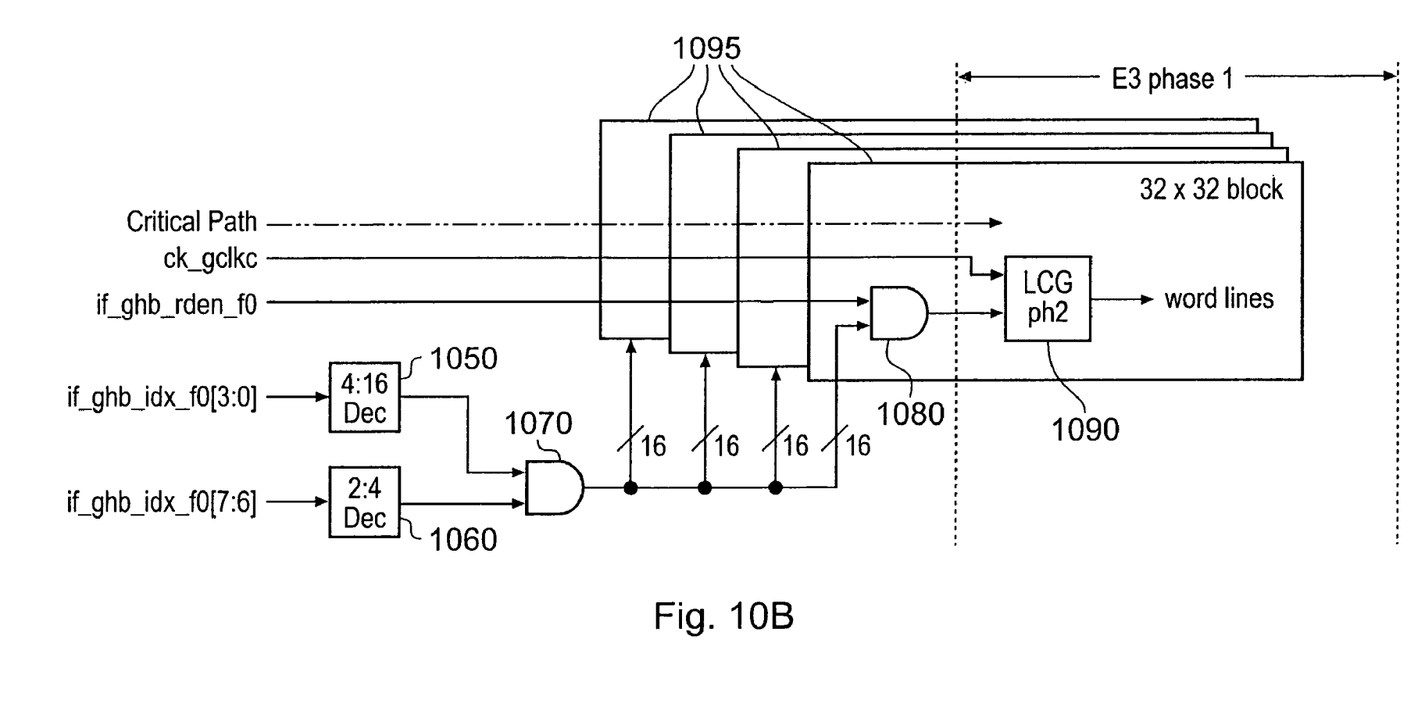

FIGS. 10A and 10B schematically illustrate portions of circuitry used in the global history buffer 140 of FIG. 1 to implement the present technique. In the arrangement of FIG. 10A a physical signal IF_GHB_IDX_F0[7:6] is supplied as input via a decoder 1010 as a select signal to a 4:1 multiplexer 1020. This physical signal serves to select 1 of 4 blocks of a 16 by 16 memory array. A second physical signal IF_GHB_IDX_F0[5:4] is supplied via the further decoder 1030 to another 4:1 multiplexer 1040, which serves to select between 1 of 4 columns of the given block. In this arrangement an 8-bit physical signal IF_GHB_IDX_F0[0:7] is used to index the memory array. Bits 4 and 5 of this 8-bit array are used to index the columns of the array whereas bits 6 and 7 are used to index the 4 blocks of the memory array.

FIG. 10B schematically illustrates a further portion of the global history buffer 140 circuitry. In this case, bits 0 to 3 of the physical signal (which are used to select one of 16 rows of the memory array) are supplied as input to a 4:16 decoder whereas bits 6 and 7 of the physical signal, (which are used to select 1 of 4 blocks of the memory array) are supplied as input to a 2:4 decoder 1060. The outputs of both of these decoders 1050, 1060 are supplied as input to a logical AND gate 1070 and the output of this AND gate 1070 is supplied as input to a further AND gate 1080 and thereafter to a circuit element 1090 before being output to the wordlines of the memory array. The output of the AND gate 1070 is supplied to each of a plurality of memory blocks 1095.

Figure 11:
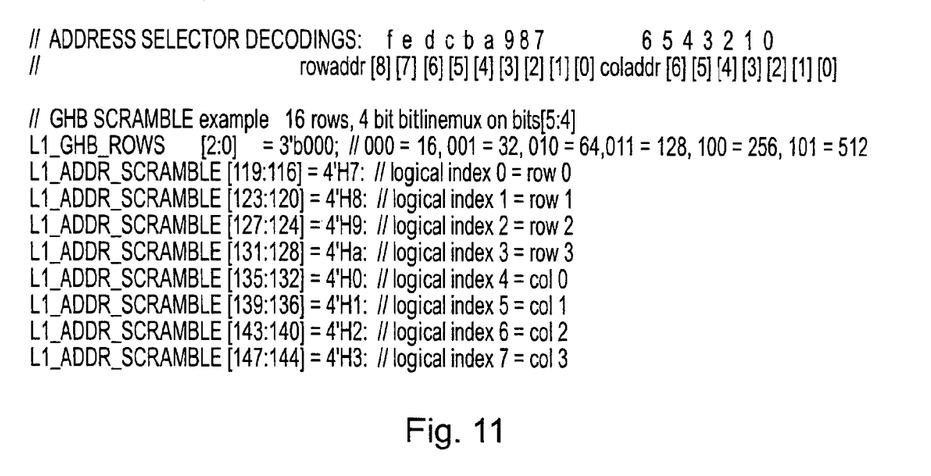
FIG. 11 schematically illustrates a portion of verilog code that defines a generated address to a re-mapped address mapping to be loaded into an instruction register of the self-test controller.
Figure 12:
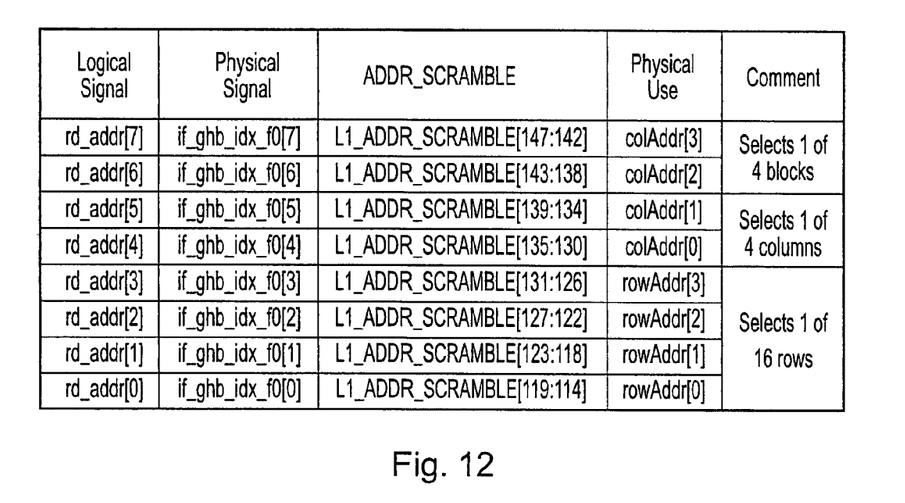
FIG. 12 is a table that summarises a re-mapping between generated addresses and remapped addresses in the particular implementation of FIGS. 10A, 10B and 11.

FIG. 11 is a portion of verilog code, which defines a mapping between generated addresses and re-mapped addresses. This mapping selection data is loaded into the instruction register of the self-test controller. The verilog code shows a sequence of operations that involve assigning an 8-bit logical address index to 4 row address bits and 4 column address bits. In particular, logical indices 0 to 3 are assigned to row address bits 0 to 3 whereas logical indices 4 to 7 are assigned to column address bits 0 to 3 respectively. The 8-bit addresses index a 16 row by 16 column memory array. The table of FIG. 12 details the mapping between the logical signals and the physical signals of the memory array. Address scramble information (corresponding to mapping selection data) specified in the middle column of the table of FIG. 12 is implementation dependent and therefore is programmed along with the self-test instruction load. The programming of the physical mappings requires knowledge of both the number of rows per bitline pair in the memory array and the index usage within the memory array. Failure to provide a correct mapping will result in logical testing of the memory array as opposed to physically targeted testing that reproduces the intended memory cell physical access pattern to probe the appropriate potential memory defect. The generated memory addresses and the re-mapped memory addresses correspond to two distinct schemes for indexing of the memory array cells and could be logical memory addresses or physical memory addresses. However, the overall result of the re-mapping process is that the intended memory cell physical access pattern is achieved in execution of the memory test algorithm regardless of the particular implementation of the memory array under test and the manner in which different memory cells are accessed by memory control signals in that implementation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data, said apparatus being operable in an operational mode and a self-test mode, said apparatus comprising:
   at least one memory having a plurality of memory cells arranged according to a physical configuration, wherein physical locations in said at least one memory of said plurality of memory cells are selected by respective memory addresses;
   a self-test controller operable in said self-test mode to generate in response to a self-test instruction a sequence of generated memory addresses for performing respective memory-access operations in accordance with at least one memory test algorithm having an associated memory cell physical access pattern; and
   a programmable remapper, responsive to programmable mapping selection data, for remapping said sequence of generated memory addresses to a sequence of remapped memory addresses for selecting memory cells in said at least one memory, wherein said memory cells are accessed in accordance with said associated memory cell physical access pattern.

2. Apparatus according to claim 1, wherein said mapping selection data is loaded by said self-test controller substantially simultaneously with loading of said self-test instruction.

3. Apparatus according to claim 1, wherein said self-test instruction comprises a pattern selection field for specifying said memory cell physical access pattern.

4. Apparatus according to claim 1, wherein said self-test instruction comprises a mapping selection data field for specifying said mapping selection data.

5. Apparatus according to claim 1, wherein said self-test instruction comprises a data field for specifying data to be written to said memory during said memory access operations.

6. Apparatus as claimed in claim 1, comprising a plurality of memories and wherein said self-test instruction specifies to which of said plurality of memories said self-test instruction is to be applied.

7. Apparatus according to claim 1, wherein said mapping selection data is reprogrammed to match a change in physical layout of said at least one memory.

8. Apparatus according to claim 1, wherein said mapping selection data is reprogrammed to match a change in an implemented control configuration for a fixed physical layout of said at least one memory.

9. Apparatus according to claim 1, comprising a processor core, said processor core, said at least one memory and said self-test controller being fabricated together on an integrated circuit.

10. Apparatus according to claim 1, wherein said at least one memory is one of a synthesized memory and a custom memory.

11. Apparatus according to claim 1, wherein said at least one memory test algorithm implements one or more of the following memory test operations:
   (i) writing specified data to all memory cells within a range of said memory addresses;
   (ii) reading data from all memory cells within a range of said memory addresses;
   (iii) write specified data to memory cells having a checkerboard pattern of memory addresses;
   (iv) read data from memory cells having a checkerboard pattern of memory addresses;
   (v) conduct a march C memory test;
   (vi) read data from and write specified data to a sequence of memory cells within a memory arranged in rows and columns of memory cells such that memory cells within a row of memory cells are accessed in turn before a next row of memory cells is selected for access;
   (vii) read data from and write specified data to a sequence of memory cells within a memory arranged in rows and columns of memory cells such that memory cells within a column of memory cells are accessed in turn before a next column of memory cells is selected for access;
   (viii) read data from, write specified data to and read data from a sequence of memory cells within a memory arranged in rows and columns of memory cells such that memory cells within a row of memory cells are accessed in turn before a next row of memory cells is selected for access;
   (ix) read data from, write specified data to and read data from to a sequence of memory cells within a memory arranged in rows and columns of memory cells such that memory cells within a column of memory cells are accessed in turn before a next column of memory cells is selected for access;
   (x) for a sequence of memory cells, repeatedly write a value to one or more bitlines within said memory and then read a complementary value stored within a memory location sharing said one or more bitlines; and
   (xi) for a sequence of memory cells, repeatedly read a value from a memory location while interjecting opposing data writes;
   (xii) a predetermined combination of memory test operations as defined in (i) to (xi) for go/nogo testing where manufacture's test methods do not have specific requirements; and
   (xiii) creating false read data at specific points in order to validate fail detection.

12. A method of testing a memory having a plurality of memory cells arranged according to a physical configuration, physical locations in said at least one memory of said plurality of memory cells being selected by respective memory addresses, said method comprising the steps of:
   generating, in response to a self-test instruction, a sequence of generated memory addresses for performing respective memory-access operations in accordance with at least one memory test algorithm having an associated memory cell physical access pattern; and
   remapping, in response to programmable mapping selection data, said sequence of generated memory addresses to a sequence of remapped memory addresses for selecting memory cells in said at least one memory, wherein said memory cells are accessed in accordance with said associated memory cell physical access pattern.

13. Apparatus for processing data, said apparatus being operable in an operational mode and a self-test mode, said apparatus comprising:
   at least one means for storing having a plurality of memory cells arranged according to a physical configuration, wherein physical locations in said at least one means for storing being selected by respective memory addresses;
   means for controlling self-test operations and, in said self-test mode, for generating, in response to a self-test instruction, a sequence of generated memory addresses for performing respective memory-access operations in accordance with at least one memory test algorithm having an associated memory cell physical access pattern; and
   means for programmably remapping addresses, responsive to programmable mapping selection data, for remapping said sequence of generated memory addresses to a sequence of remapped memory addresses for selecting memory cells in said at least one means for storing, wherein said memory cells are accessed in accordance with said associated memory cell physical access pattern.

* * * * *